United States Patent [19]
Henkelmann

[11] Patent Number: 5,278,493
[45] Date of Patent: Jan. 11, 1994

[54] MULTIMETER HAVING A MEASUREMENT RANGE SWITCH

[75] Inventor: Dieter Henkelmann, Nürnberg, Fed. Rep. of Germany

[73] Assignee: ABB Patent GmbH, Mannheim, Fed. Rep. of Germany

[21] Appl. No.: 754,406

[22] Filed: Sep. 3, 1991

[30] Foreign Application Priority Data

Sep. 1, 1990 [DE] Fed. Rep. of Germany ....... 4027803

[51] Int. Cl.⁵ ............................................. G01R 15/08
[52] U.S. Cl. ..................................... 324/115; 324/110
[58] Field of Search ................. 324/115, 99; 340/635, 340/656, 720, 721, 722

[56] References Cited

U.S. PATENT DOCUMENTS

| | | | |
|---|---|---|---|
| 4,604,569 | 8/1986 | Tedd et al. | 324/115 |
| 5,027,057 | 6/1991 | Mageland et al. | 324/115 |
| 5,063,344 | 11/1991 | Linke | 324/115 |

FOREIGN PATENT DOCUMENTS 2055480  3/1981  United Kingdom ................ 324/115

Primary Examiner—Vinh Nguyen
Attorney, Agent, or Firm—Herbert L. Lerner; Laurence A. Greenberg

[57] ABSTRACT

In multimeters for the selective measurement of different measurable variables having test signals that are detected by the multimeter through the use of various input circuits assigned to respective measurable variables, an input circuit can be connected which is not suitable for an input variable set at a measurement range switch. In order to draw the attention of the operator at least to an error that the operator is responsible for, at least one auxiliary circuit is provided and fed through the measurement range switch in such a manner that a fixed assignment to a particular input circuit and consequently to a particular measurable variable results. The assignment is dependent on a switch position. Inserted in the auxiliary circuit is at least one function generator which triggers a function or a combination of a plurality of functions upon actuation, which is preferably achieved by closing the auxiliary circuit. This counteracts the operating error in switching the measurable variable.

27 Claims, 5 Drawing Sheets

MULTIMETER HAVING A MEASUREMENT RANGE SWITCH

The invention relates to a multimeter having a measurement range switch for the optional measurement of different measurable variables having test signals that are detected by the multimeter by means of various input circuits, each being assigned to a particular measurable variable, and in which a particular measurable variable is selected with the aid of a measurement range switch.

Multimeters offer the possibility of measuring a multiplicity of measurable variables, in particular voltages, currents and resistances, with the same instrument. Some of the measurement circuits which are required to cover the various measurable variables differ quite considerably, which means that different input circuits for the measurement have to be available for the various measurable variables.

Due to the versatile applicability thereof, multimeters enjoy great popularity not only in laboratories and workshops, but also among hobbyists. However, the versatility of the multimeters also involves dangers.

Thus, it is important that the correct input circuit assigned to the measurable variable to be determined, be connected before every measurement. For example, if the mains voltage is to be measured and the input circuit which is provided for the measurement of currents is accidentally left switched on, that can have serious consequences for the multimeter, and sometimes even for the operator if the mains fuse does not switch off quickly enough. The instrument fuse provided in the multimeter is generally not sufficient to isolate the multimeter from a high-energy voltage source since the arc which occurs when the circuit opens may bridge the instrument fuse.

Similar problems and dangers may also arise for the test object, the multimeter and the operator in other combinations in which a measurable variable is fed to an incorrect input circuit. However, even if no direct danger results from an operating error, a direct hazard may always arise if, for example, the indicator of the multimeter simulates the absence of a voltage to be tested because an input circuit has been connected which happened to be out of operation, that is to say not connected to the test system. As a result of the simulated freedom from voltage, the operator is sometimes encouraged to carry out operations which endanger him or her.

Attention must be paid to the structure of the instrument in order to avoid such incorrect operations thereof. In many multimeters, the various input circuits have a first input connection which is common to all of the input circuits and a second separate input connection which is assigned to the particular measuring circuit and corresponds to the associated measurable variable. As a rule, a plurality of measurement ranges in turn belong to every measurable variable, for example the measurement ranges 1, 3, 10, 30V, etc., for the measurable variable "voltage". In that case, the input circuit has a voltage divider, across which all of the voltages are divided down, or even increased by amplification, so that values are available which are matched to the measuring system.

A measurement range switch is used in order to switch the voltage divider to a desired voltage measurement range or to switch shunts to a desired current measurement range. During operation of the measuring instrument, care must therefore be taken to ensure that the measurement range switch is set to the measurable variable which is to be measured. At the same time, however, care has to be taken to ensure that the measuring conductors are connected to the correct input connections and consequently to the correct input circuit, on the input side of the multimeter.

In the case of less concentrated activities and especially those carried out by non-skilled persons, one of the two operating movements may naturally be forgotten and then either the incorrect input circuit may be connected, or an incorrect measuring range may be switched on.

Attempts have, of course, been made to keep the dangers of an incorrect operation within limits by means of additional safety measures. The protective circuits that are used employ passive and active switches, relay switches, controlled semiconductor switches with transistors and thyristors and fusible links with special constructions. However, despite the expenditure, which in some cases is quite high, in the event of a fault it is by no means always possible with the prior art to reliably switch off high-power voltage sources within the small space available in modern multimeters. A reduction in the dangers can consequently only be achieved if incorrect operation is largely eliminated.

Attempts have been made to solve this problem by replacing the transposition of the measuring conductors with switching of the input circuits. Although this has simplified the operation of the measuring instrument somewhat, the problem was not eliminated. Thus, the switching of the input circuits can either be carried out by an additional input circuit switch or can additionally be taken over by the measurement range switch. An additional input circuit switch only shifts the problem to another component since care then has to be taken with equal attentiveness to ensure that both the input circuit switch and the measurement range switch are set for the measurable variable to be determined. On the other hand, a combination of all of the switching functions at the measurement range switch means that the latter has to be capable of switching not only very small but also large powers, and that again results in a considerable increase in the price of the component. In addition, it must be remembered that the reduction in the number of operating elements achieved with such measures does not inevitably make the operation substantially safer, since even a single switch can always still be set to an incorrect switch position, which then inevitably leads to the connection of an incorrect input circuit with corresponding consequences. In that respect, the need to scrutinize the correct setting of two operating elements may result in an increased attentiveness.

It is accordingly an object of the invention to provide a multimeter having a measurement range switch, which overcomes the hereinafore-mentioned disadvantages of the heretoforeknown devices of this general type and in which the danger of an incorrect operation is substantially reduced so that the only input circuit connected to the test signal is that input circuit to which the measurable variable being set with the measurement range switch is assigned.

With the foregoing and other objects in view there is provided, in accordance with the invention, a multimeter, comprising input circuits each being assigned to a different respective measurable variable for detecting test signals of the measurable variables, a measurement range switch being connected to the input circuits and having switch positions for selectively measuring and selecting the measurable variables, and at least one auxiliary circuit being fed through the measurement range switch and being fixedly assigned to given input circuits and measurable variables in dependence on the switch positions, the at least one auxiliary circuit having at least one function generator being actuated preferably by closing the auxiliary circuit, for triggering a function or a plurality or combination of functions counteracting operating errors in switching the measurable variables.

By coupling an auxiliary circuit to the measurement range switch so as to obtain a fixed assignment to a particular input circuit and consequently to a particular measurable variable, depending on the switch position, it is possible to use the auxiliary circuit to activate a function generator which can initiate a function that draws the attention of the user to operating errors or even prevents the operating errors.

On one hand, the protective circuit being formed of one or more auxiliary circuits with associated function generators is determined in relation to the safety which it offers, but on the other hand in relation to the technical cost, it is also determined substantially by the function generators being used. Therefore, in accordance with another feature of the invention, the at least one function generator is a position generator and preferably a magnetic positioner, and there is provided at least one input circuit switch and/or at least one auxiliary switch being switched on and off by the position generator and/or at least one locking system for locking the measurement range switch in particular and/or at least one safety catch, being actuated by the position generator.

In accordance with a further feature of the invention, in order to protect the relevant input circuit, the magnetic positioner may control an input circuit switch in such a manner that the input circuit switch can only be switched on if the measuring conductor makes contact to that input connection to which precisely the measurable variable selected with the measurement range switch is assigned. For this purpose, in accordance with an added feature of the invention, the magnetic positioner is controlled by an auxiliary circuit which only closes if on one hand, a switching section associated with the measurement range switch is closed and on the other hand, a contact maker integrated in the input connection is closed. In this connection, the contact maker closes as soon as the input connection, which is preferably constructed as a socket contact, is contacted by a measuring conductor provided with a plug. Suitable insulating parts ensure that the auxiliary circuit remains electrically isolated from the input circuit.

In accordance with an additional feature of the invention, the magnetic positioner actuates not only the input circuit switch but also an auxiliary switch and when the magnetic positioner responds by connecting a measuring conductor, the auxiliary switch switches on a signal generator, preferably a buzzer, so that the signal generator delivers a signal if the input circuit switch does not close with measuring conductor connected. Since the signal is an indication that a measurable variable other than that due to connecting the measuring conductor has been selected with the measurement range switch, the user of the multimeter is able to correct his or her operating error.

A locking of the measurement range switch, which is possibly also initiated by the same magnetic positioner, protects the switch against unintentional switching for as long as an input circuit is connected. This means that the input circuit has to be opened, and consequently become current-free, as a result of removing the measuring conductor from the input connection before the measurement range switch can be switched and the input circuit switch can then also open. Opening the input circuit switch while under load is therefore avoided. The user is also then compelled to connect the measuring conductor to the associated correct input connection after switching the measurement range switch.

Diverse possible solutions arise for constructing the locking elements. However, in accordance with yet another feature of the invention, the locking elements include a first locking element acting on a second locking element which is constructed on a movable part of the measurement range switch, the locking elements being positioned in such a way that after engagement has taken place, switching of the measurement ranges with the measurement range switch is only possible in the range of the measurable variable which has just been set. It is consequently not intended to completely lock the measurement range switch, but only to prevent switching from one measurable variable to another.

In accordance with yet a further feature of the invention, instead of an input circuit switch which interrupts the input circuit for the purpose of disabling, a safety catch which is actuated by the magnetic positioner is built into at least one of the input connections and is triggerable for preventing any contact being made to the input circuit concerned with the measuring conductor.

In accordance with yet an added feature of the invention, the contact maker is built into the input connection in addition to the safety catch, and the contact maker closes when a measuring conductor is plugged in for activating a magnetic positioner a triggering locking system for locking the measurement range switch and preventing the measurement range switch from being switched to another measurable variable with measuring conductor connected. It is therefore also possible with this type of protective circuit to ensure that, because of the safety catch, contact can only be made to that input connection to which the measurable variable set with the measurement range switch is assigned, and the locking system only permits switching of the measurement range switch if the measuring conductor is again removed from the input connection concerned.

In accordance with yet an additional feature of the invention, a plurality of input connections for making contact to various input circuits are replaced by an input circuit switch facilitating operation of the multimeter, since the transposition of the measuring conductors is dispensed with. Therefore, in accordance with again another feature of the invention, a manually actuable input circuit switch is coupled to an auxiliary circuit switch in an auxiliary circuit and both switches can be switched from a zero position to another measurable variable, depending on the switching direction. However, in this switching operation the auxiliary circuit switch must lead the input circuit switch to such an extent that a magnetic positioner in the auxiliary circuit can disable a manually actuable input circuit switch before it switches on by means of a locking system if the measurement range switch is set to a measurable variable other than that which should be set by means of the input circuit switch.

In accordance with again a further feature of the invention, in order to prevent the measurement range switch from being capable of being switched with the input circuit switch switched on in the case of this protective circuit as well, a magnetic positioner is again provided which is controlled by a contact maker of the auxiliary circuit switch in such a way that the latter only clears a locking system of the measurement range switch in the zero position. Before switching the measurement range switch to another measurable variable, the input circuit switch consequently has to be switched back to the zero position before the locking system clears the measurement range switch.

Since the input circuit switch should be in the zero position at the beginning of every new measurement in order to be able to start from the latter and select the appropriate measurable variable on the input circuit switch and also on the measurement range switch, it is advantageous if provision is made for an automatic resetting of the input circuit switch as soon as a measurement is terminated. For this purpose, in accordance with again an added feature of the invention, there is provided a magnetic positioner resetting the input circuit switch to its zero position and being activated whenever an amplifier monitoring the input signal detects that the input signal has disappeared or has at least dropped below a negligible threshold value.

In accordance with again an additional feature of the invention, there are provided a plurality of input connections, and auxiliary circuits making it possible to activate magnetic positioners which in turn actuate associated input circuit switches, and in each case only a common input connection is assigned to the various input circuits. In this case, the contact maker integrated into the input connections is replaced by an auxiliary switch having a zero position and further switch settings corresponding to the number of contact makers, in such a manner that the switching section of the auxiliary switch, which acts as a switch, only releases one magnetic positioner in each case for activation analogously to the contact makers.

In accordance with a concomitant feature of the invention, the function generator is an indicator lamp being assigned to a particular input circuit by means of suitable auxiliary circuits in such a manner that the type and/or spatial assignment of the optical signal reveals which input circuit the measuring conductor has to be connected to after suitably positioning the measurement range switch, if the input circuits are applied to different input connections or have to be suitably switched.

Other features which are considered as characteristic for the invention are set forth in the appended claims.

Although the invention is illustrated and described herein as embodied in a multimeter having a measurement range switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
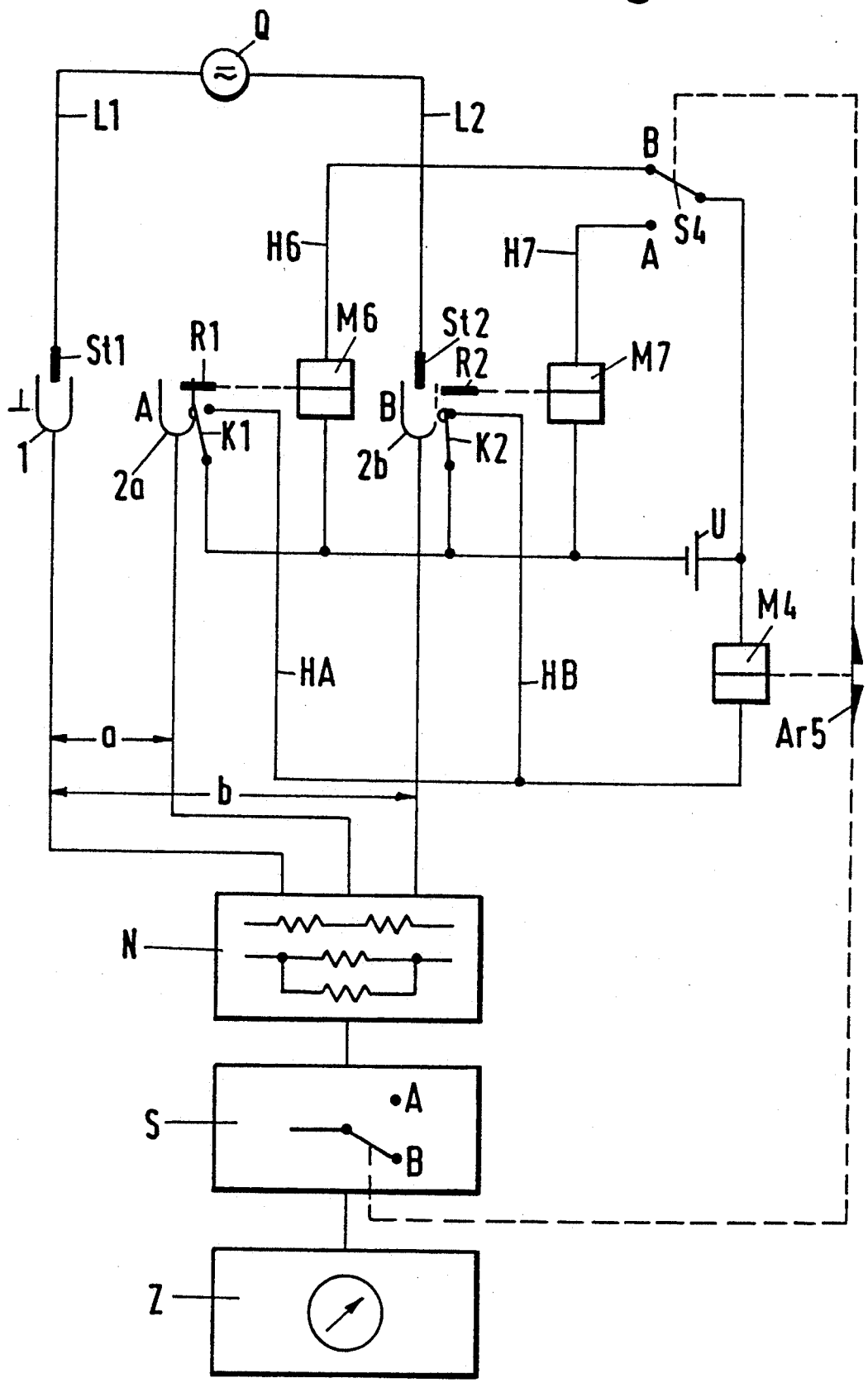
FIG. 1 is a basic schematic diagram of a circuit for disabling certain input connections by means of a safety catch in a multimeter having a plurality of input connections.

Referring now to the figures of the drawing in detail and first, particularly, to FIG. 1 thereof, there is seen a basic circuit diagram showing a test object Q, for example a voltage source, which is connected to input connections 1, 2 of a multimeter by means of measuring conductors L1, L2 and first and second plugs St1, St2. The multimeter has two input circuits a, b having the one input connection 1 which is common to both and specific input connections 2a, 2b assigned to the particular input circuits. The different construction of the input circuits a, b will be illustrated by a measurement range network N which may, for example, be formed of voltage divider resistors for voltage switching or shunts for current switching and in which the switching is carried out by a measurement range switch S. A correspondingly matched test signal is then fed to a measuring system Z which serves to process the measured value and for indication thereof.

There is a relationship between the input connections 2a, 2b, to which respective measurable variables A, B are assigned, and the switch position of the measurement range switch S assigned to the measurable variables. The relationship forces the measuring conductor L2 to be connected to the correct input connection 2a, 2b. In order to prevent the user from making errors in this connection, the input connections 2a, 2b, which are constructed as socket contacts, are each provided with a safety catch R1, R2 which can be set to a disabling position by means of a function generator in the form of an associated magnetic positioner M6, M7. The disabling position protects the input connection against making contact. The magnetic positioners M6, M7 are controlled by a contact maker S4 of the measurement range switch S, which switches on an auxiliary circuit H6 or H7 through a voltage source U. The switching-on of the auxiliary circuits H6, H7 to activate the magnetic positioners, M6, M7 consequently takes place in fixed coupling with the measurable variable switching of the measurement range switch S. In the present example, the measurable variable B was selected by means of the measurement range switch S so that the protective circuit has to ensure that the input connection 2a assigned to the measurable variable A is disabled and the input connection 2b assigned to the measurable variable B makes contacting possible. The control of the magnetic positioners M6, M7 is only intended to illustrate the principle and it can, of course, take place with quiescent or working current or even as a result of individual control pulses in the case of bistable magnetic positioners.

An essential feature of the effectiveness of the protective circuit is that it cannot be disabled by switching the measurement range switch S to an unpermitted measurement range with the measuring conductor L2 connected. In order to achieve this, a locking device Ar5 is provided which prevents the measurement range switch S from being switched further upon actuation by a function generator in the form of a magnetic positioner M4. The magnetic positioner M4 is controlled by a contact maker K1, K2 which is also built into the socket contact of the input connection 2a, 2b and is able to activate an auxiliary circuit HA, HB which contains not only the magnetic positioner M4 but also the voltage source U. The triggering of this activation is effected by the second plug St2 which displaces a cam of the contact maker K2 that projects into the socket contact 2b upon plugging in and consequently closes the contact. Since the locking system Ar5 is only initiated if the contacts of both contact makers K1, K2 are opened, the second plug St2 has to be pulled out of the socket contact 2a, 2b as the case may be, before the measurement range switch can be switched. It is only possible to reinsert the second plug St2 again into that socket contact which has not been disabled by the associated safety catch R1, R2.

Figure 2:
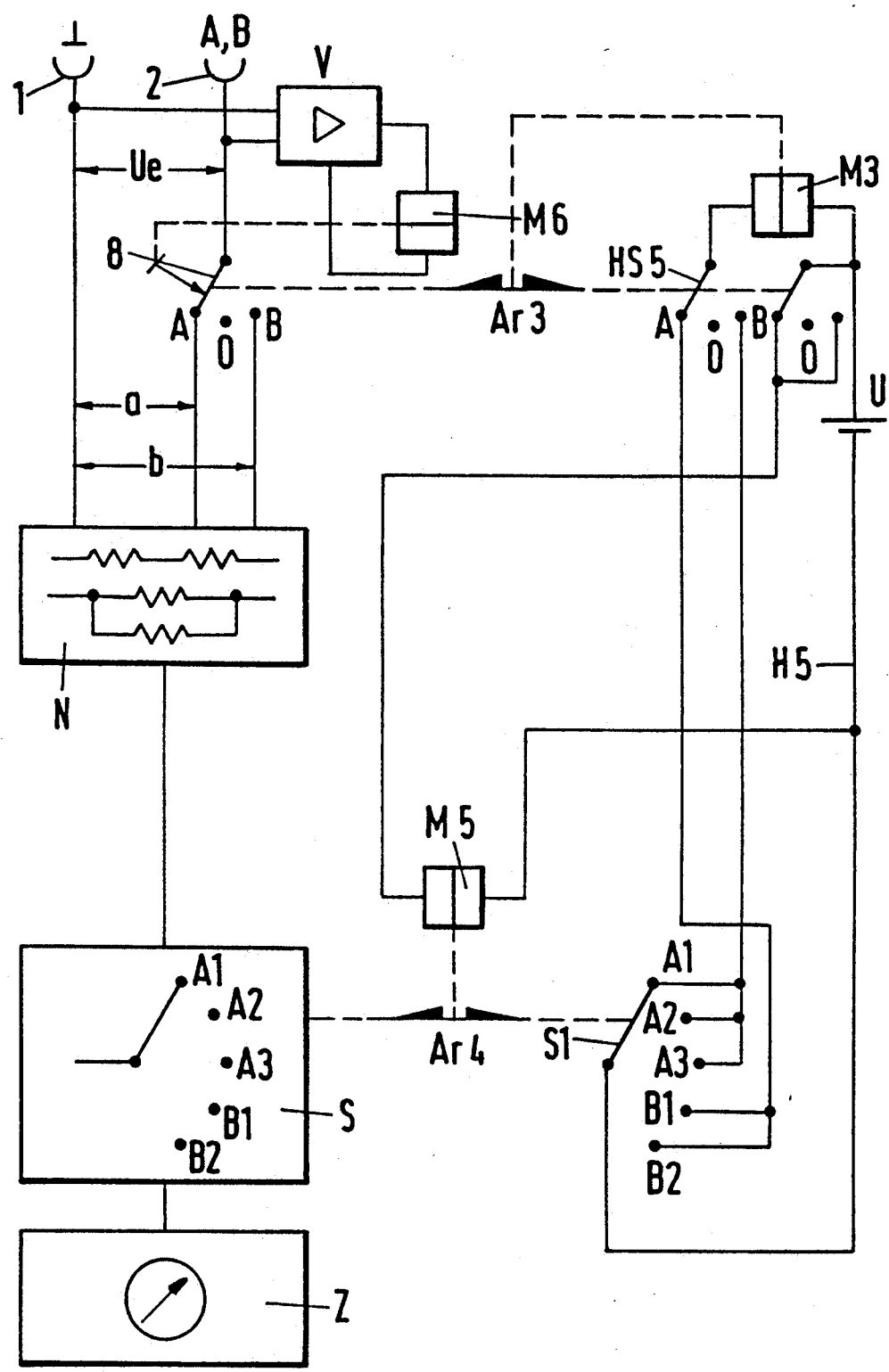
FIG. 2 is a basic diagram of a circuit for disabling certain input circuits in a multimeter having two common input connections and a manually actuated input circuit switch.

The basic circuit diagram depicted in FIG. 2 essentially corresponds to that in FIG. 1 insofar as the multimeter construction is concerned, but it differs in that instead of a plurality of specific input connections 2a, 2b, common input connections 1, 2 are provided for both of the input circuits a, b so that a transposition of measuring conductors L1, L2 is unnecessary. As a replacement for the transposition, an input circuit switch 8 has been inserted into the circuit. Starting from a zero position 0, the input circuit switch 8 can be switched to a measurable variable A or B and consequently to the input circuits a, b.

An auxiliary circuit switch HS5 associated with or mechanically coupled to the input circuit switch 8, is also switched to a switch position assigned to the measurable variable A or B starting from a zero position 0. The auxiliary circuit switch HS5 is situated in an auxiliary circuit H5, together with a function generator in the form of a magnetic positioner M3 connected in series, a voltage source U and a switching section S1 of the measurement range switch S.

The measurement range switch S makes it possible to switch between the measurable variables A and B on one hand and also between various measurement ranges A1, A2, A3 of the measurable variable A and various measurement ranges B1, B2 of the measurable variable B. The setting of the switching section S1, which is dependent on the setting of the measurement range switch S, is connected to the auxiliary circuit switch HS5 in such a manner that the magnetic positioner M3 and the locking system Ar3 which depends on it is activated as soon as the auxiliary circuit switch HS5 is set to a measurable variable other than the measurable variable selected by the measurement range switch S. The auxiliary circuit switch HS5 is at the same time constructed in such a way that it leads the input circuit switch 8 during the switching operation and if switched to an incorrect measurable variable, the locking system Ar3 also comes into operation in due time so that it prevents switching of the input circuit switch to an incorrect measurable variable.

In the switch settings shown in FIG. 2, the measurable variable A set on the measurement range switch S agrees with the measurable variable set on the input circuit switch 8. However, if an attempt is made to switch the input circuit switch 8 to the measurable variable B, the magnetic positioner M3, and consequently the locking system Ar3, would be activated by means of the leading auxiliary circuit switch HS5 in such a manner that the input circuit switch 8 would have to be switched back again to the zero position 0.

The operation of the circuit described above ensures that after a measurable variable has been selected by the measurement range switch S, it is only possible to switch on that input circuit a, b to which the same measurable variable is assigned. However, in addition, it should be ensured that with the input circuit switch 8 switched on, and consequently the input circuit a or b of the measurement range switch S closed, it is not possible to switch to another measurable variable. This can be achieved with the aid of a second switching section of the auxiliary circuit switch HS5, which has a zero position 0, starting from which it is possible to switch to one of the measurable variables A, B, in the same way as its first switching section. A function generator in the form of a further magnetic positioner M5 is controlled with the aid of the voltage source U of the auxiliary circuit H5 by means of this second switching section. The locking system Ar4 ensures that the measurement range switch S can only be switched if the input circuit switch 8 is in the zero position 0. It is consequently not possible for the user of the multimeter to accidentally switch the measurement range switch S to another measurable variable with the input circuit switch switched on.

Despite the measures taken to increase the operating safety of the multimeter, there remains a possibility of a measurable variable which is unsuitable for the test signal to be measured having already been set before the multimeter was put into operation. In order to compel the user to check the multimeter setting before connecting a new test object, another magnetic positioner M6 is provided which monitors a test signal Ue with the aid of an amplifier V and always effects a resetting of the input circuit switch 8 to its zero position 0 if it disappears.

The basic circuit diagram according to FIG. 3 is again a multimeter with a plurality of input connections 1, 2a, 2b corresponding to the basic circuit diagram according to FIG. 1 that was already explained. In the remaining construction as far as it relates to the multimeter, the two circuit diagrams substantially agree, and this is also illustrated by the same reference symbols. However, as far as the protective circuit is concerned, there are significant differences since, according to FIG. 3, safety catches are not employed to block the input connections 2a, 2b. Instead, the interruption or release of the input circuits a, b is brought about by input circuit switches 6, 7. The input circuit switches are again actuated as a function of the switch position of the measurement range switch S in such a manner that only that input circuit switch 6, 7 is switched on, which is situated in an input circuit a, b to which the measurable variable set at the measurement range switch S corresponds. This is achieved with two switching sections S2, S3 which are associated with the measurement range switch S and which, together with one function generator in the form of a magnetic positioner M1, M2 each, are situated in an auxiliary circuit H1, H2 and serve to control the respective input circuit switch 6, 7.

It is important for the functioning of the protective circuit that there is no rigid coupling between the measurement range switch S or its switching sections S2, S3 and the input circuit switches 6, 7 in such a manner that the input circuits a, b assigned to the measurable variables A, B would be unavoidably switched. Instead, the switching-on of the input circuit switches 6, 7 should depend on a further condition. This further condition is provided with the aid of contact makers K1, K2, each of which is assigned electrically to the auxiliary circuits H1, H2 and mechanically to the input connections 2a, 2b which are constructed as socket contacts. The contact makers K1, K2 are integrated into the input connections 2a, 2b so that they only close if a plug St2 is plugged in, for example if the plug St2 meets an insulating cam of the contact maker K1, K2, and in doing so displaces it to such an extent that the contact closes. Consequently, before a current which would result in an activation of the magnetic positioner M1, M2 can flow in the auxiliary circuits H1, H2, it is necessary to ensure that the plug St2 has made contact to that input connection 2a, 2b which is provided for an input variable A, B that has already been selected by the measurement range switch S.

Figure 3:
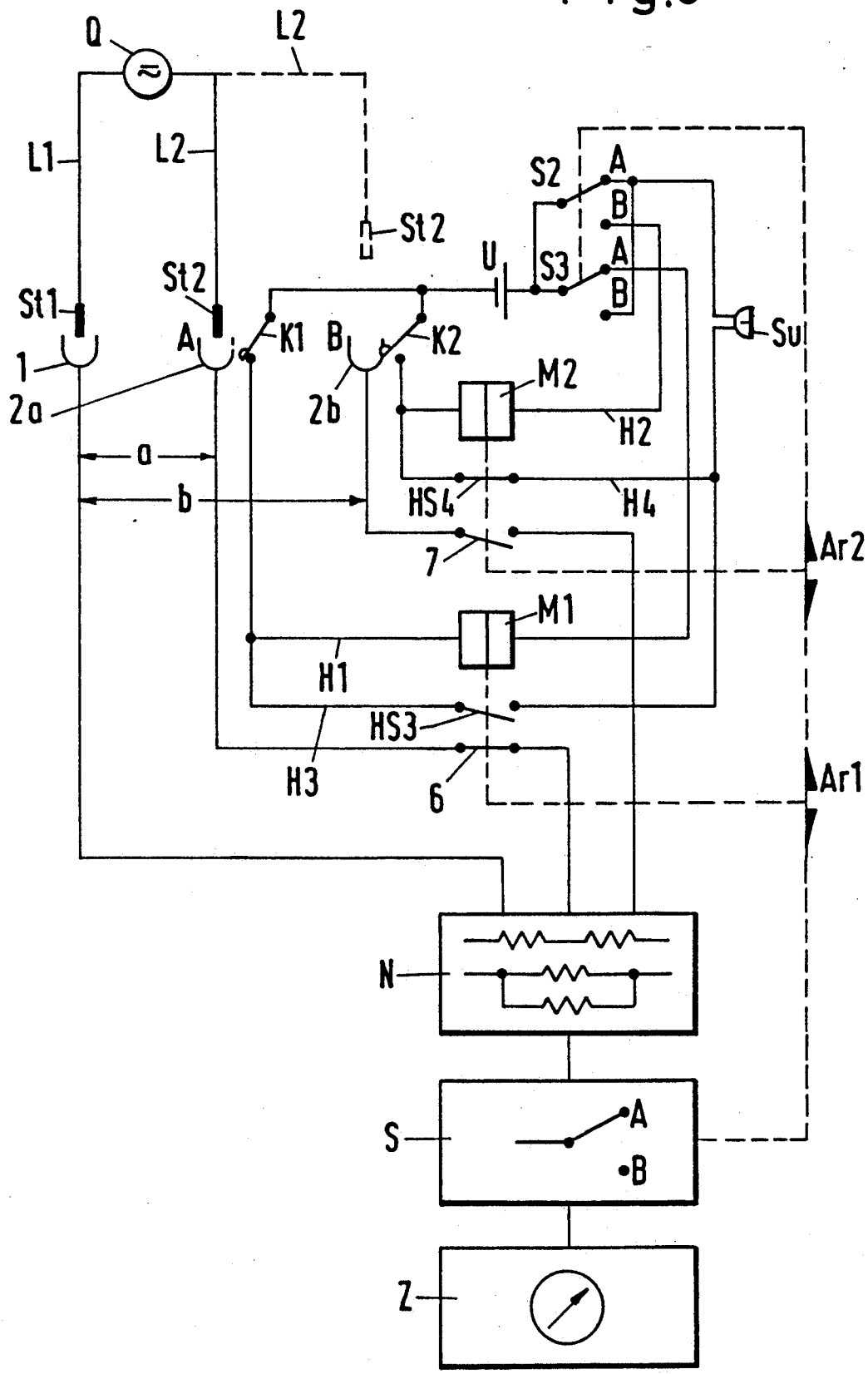
FIG. 3 is a basic diagram of a circuit for disabling certain input circuits in a multimeter having a plurality of input connections and controlled input circuit switches.

As depicted in the example according to FIG. 3, the magnetic positioner M1 can only switch on the input circuit switch 6 if the auxiliary current circuit H1 which activates it is closed when contact is made to the input connection 2a by the contact maker K1 and, like the measurement range switch S, the switching section S3 is situated in a setting corresponding to the measurable variable A. This ensures that an input current can only flow in that input circuit a, b which is provided for the measurable variable selected on the measurement range switch S.

However, the measures described on the basis of the example in FIG. 3 do not eliminate the possibility of connecting the plug St2 to the input connection 2b. Although this would not endanger the input circuit b since the switching section S2 remains open and the magnetic positioner M2 is not activated to close the input circuit switch 7, the absence of an input signal would be simulated for the measuring system Z, and this could encourage the user to perform corresponding incorrect operations. Further auxiliary circuits H3, H4 have therefore been provided which connect a signal generator Su, preferably an audible signal generator, to the voltage source U through the switching sections S2, S3 on one hand, as a function of the setting of the magnetic positioner M1, M2, and on the other hand as a function of the setting of the contact maker K1, K2. The auxiliary circuits H3, H4 are accordingly constructed in such a way that the signal generator Su is always activated if contact is made to an input connection 2a, 2b to which a measurable variable is assigned that does not correspond to the measurable variable set on the measurement range switch S. The user is consequently prompted to transpose the plug St2.

A further danger is that with the measuring conductor L2 correctly connected and the input circuit switch 6, 7 accordingly closed, the measurement range switch S may be purposely or accidentally switched to another measurable variable. Although the safety measures described above would be effective, i.e. the signal generator Su would be activated and the input circuit switch of the relevant input circuit would be opened, the latter is particularly undesirable, at least as long as, for example, a high current is flowing in the input circuit since, in this case the interruption of the current circuit could endanger the contacts of the input circuit switch. In order to preclude this danger, a locking system Ar1 assigned to the magnetic positioner M1 and a locking system Ar2 assigned to the magnetic positioner M2 are provided. The two locking systems Ar1 and Ar2 could also be combined since they both act on the measurement range switch S and lock the latter until one of the two input circuit switches 6, 7 is switched on. This means that the measurement range switch S can only be switched on if the plug St2 is removed from the input connection 2a, 2b to which contact is currently made for the purpose of transposition to another input connection. This ensures that the input circuit switch 6, 7 only opens if the input circuit is current-free.

Details of the way in which a locking of the measurement range switch can be carried out will not be gone into more deeply herein since a large number of possible solutions clearly suggest themselves. However, it is important for the locking system to be constructed in such a way that, although it is not possible to switch from one measurable variable to another measurable variable, it is possible to switch within different measurement ranges of the same measurable variable. This can be achieved without difficulties by means of a suitably coded mechanism.

Figure 4:
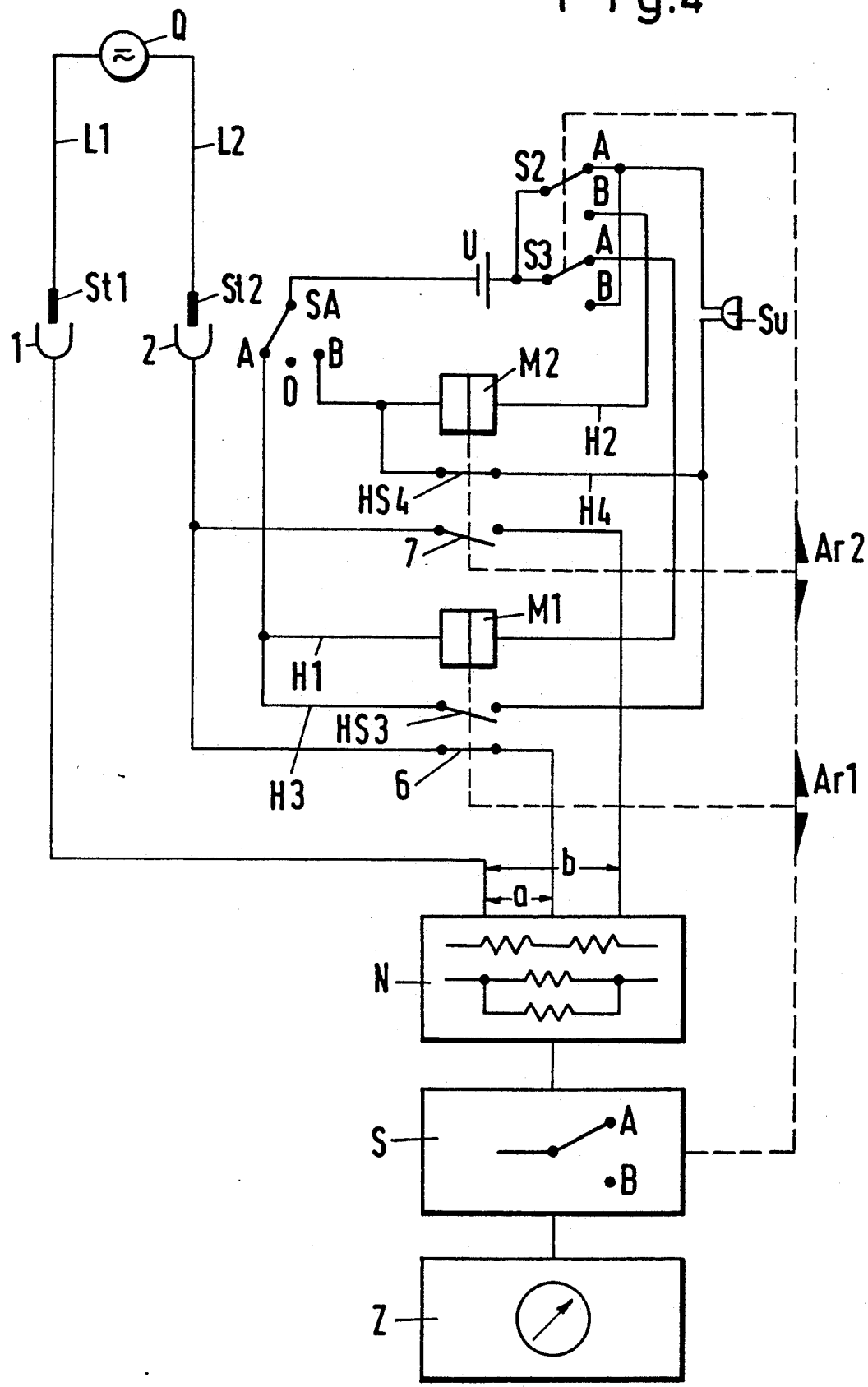
FIG. 4 is a basic diagram of a circuit for disabling certain input circuits in a multimeter with two common input connections and controlled input circuit switches.

The users of multimeters often find the transposition of the measuring conductor L2 to another input connection upon changing the measurable variable, to be troublesome. As a rule they prefer switches for switching over which make the transposition unnecessary. The construction of a suitable circuit analogous to the circuit according to FIG. 3 can readily be achieved. As FIG. 4 shows, the two input connections 2a, 2b are replaced by a common input connection 2, and this is readily possible since the input circuit switches 6, 7 permit a separate switching-on of the input circuits a, b. The need for increased attentiveness to be exerted on the part of the use with the circuit according to FIG. 3 in having to ensure the correct measurable variable A, B both in actuating the measurement range switch S and in making contact to the measuring conductor L2, can also be achieved in a corresponding manner with an auxiliary switch SA. This replaces the contact makers K1, K2 according to FIG. 3, as it were, and like the measurement range switch S, it has to be situated in a switch setting assigned to a particular measurable variable A, B.

Figure 5:
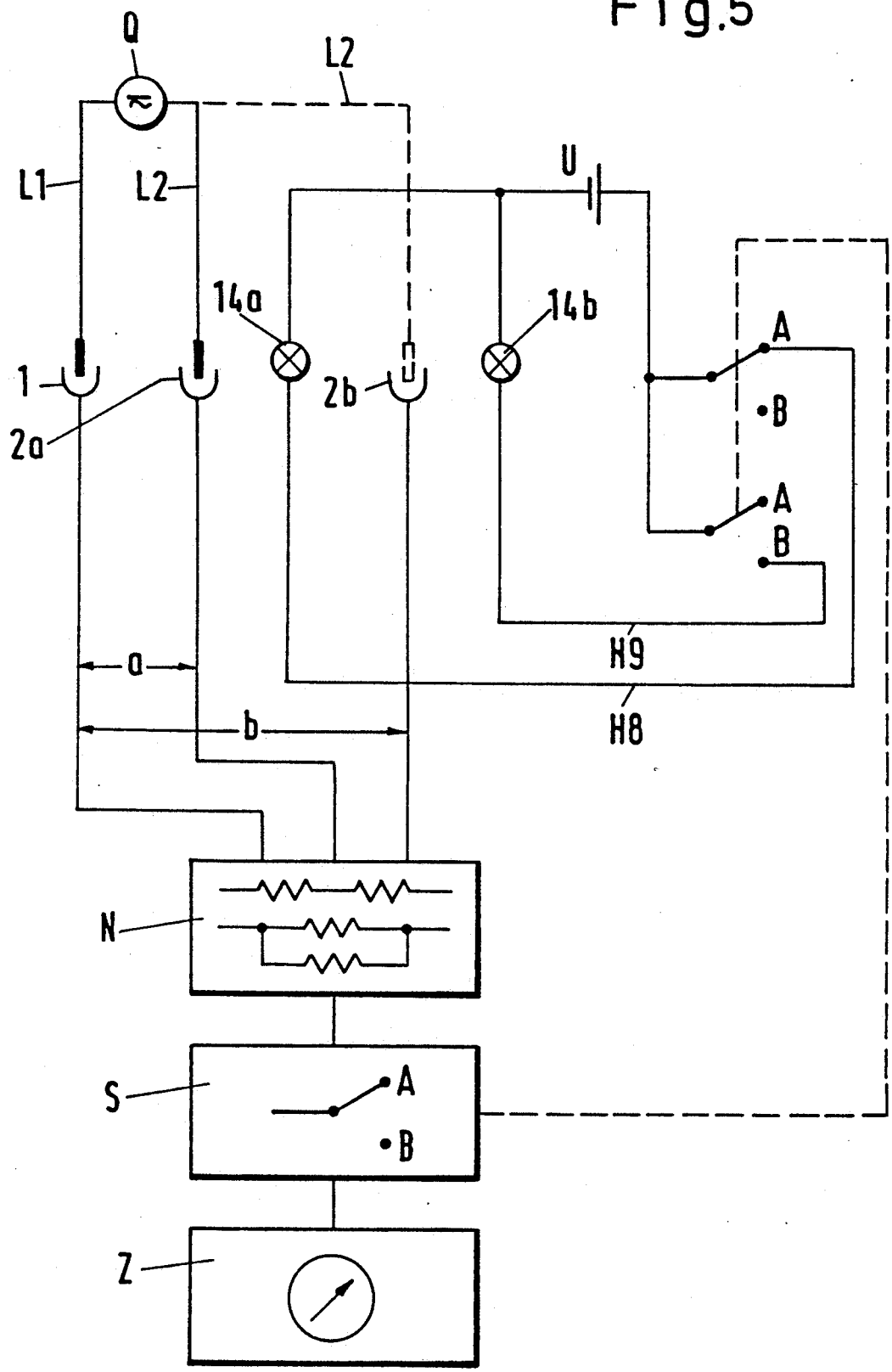
FIG. 5 is a basic diagram of a circuit for signalling the correct input connection assigned to the position of the measurement range switch in multimeters having a plurality of input connections.

According to FIG. 5, a particularly simple possibility for prompting the user of a multimeter to exercise increased attentiveness in making contact to the input connections 2a, 2b, is to switch on function generators in the form of indicator lamps 14a, 14b by means of additional switching sections of the measurement range switch S. This is done in such a manner that an indication of which of the input connections has to be made contact to in the particular switch setting of the measurement range switch S becomes visible. However, an increased protection against incorrect operations like those according to the circuits of FIGS. 1 to 4 is not achievable by these means.

I claim:

1. A multimeter, comprising input circuits each being assigned to different respective measurable variables for detecting test signals of the measurable variables, a measurement range switch being connected to said input circuits and having switch positions for selectively measuring and selecting the measurable variables, and at least one auxiliary circuit being fed through said measurement range switch and being fixedly assigned to a respective one of said input circuits and measurable variables in dependence on said switch positions, said at least one auxiliary circuit having means for triggering at least one function for counteracting operating errors in switching the measurable variables.

2. The multimeter according to claim 1, wherein said function triggering means are actuated by closing said auxiliary circuit.

3. The multimeter according to claim 1, said function triggering means include a position generator, and including at least one input circuit switch being actuated by said position generator.

4. The multimeter according to claim 3, including a contact maker, said position generator being a magnetic positioner controlling said at least one input circuit switch as a function of said contact maker.

5. The multimeter according to claim 4, wherein closing said contact maker activates said magnetic positioner which in turn closes said at least one input circuit switch.

6. The multimeter according to claim 4, including input connections to which a measuring conductor is to be connected, said contact maker being integrated into said input connections and electrically insulated from said respective input circuits, and said contact maker opens or closes said at least one auxiliary circuit upon connecting the measuring conductor.

7. The multimeter according to claim 6, wherein said input connections are socket contacts.

8. The multimeter according to claim 1, wherein said function triggering means being a position generator, and including at least one auxiliary circuit switch being actuated by said position generator.

9. The multimeter according to claim 1, wherein said function triggering means include a position generator, and including at least one locking system being actuated by said position generator.

10. The multimeter according to claim 1, wherein said function triggering means include a position generator and at least one safety catch, said safety catch being actuated by said position generator.

11. The multimeter according to claim 1, wherein said function triggering means include a magnetic positioner.

12. The multimeter according to claim 1, including input connections to which a measuring conductor is to be connected, an input circuit switch, and a switch connected in said auxiliary circuit, said function triggering means including a signal generator, and a magnetic positioner actuating said input circuit switch and said switch in said auxiliary circuit, said magnet positioner responding when the measuring conductor is connected for causing said switch in said auxiliary circuit to switch on said signal generator for emitting a signal if said input circuit switch does not close with the measuring conductor connected, the signal indicating that a measurable variable other than that due to connecting the measuring conductor has been selected with the measurement range switch.

13. The multimeter according to claim 12, wherein said signal generator is a buzzer.

14. The multimeter according to claim 12, including a locking system, said magnetic positioner protecting said measurement range switch against unintentional switching with the aid of said locking system upon closing one of said input circuits to which the same measurable variable is assigned as the measurable variable selected at said measurement range switch.

15. The multimeter according to claim 12, including a locking system, and another magnetic positioner protecting said measurement range switch against unintentional switching with the aid of said locking system upon closing one of said input circuits to which the same measurable variable is assigned as the measurable variable selected at said measurement range switch.

16. The multimeter according to claim 1, including input connections to which a measuring conductor is to be connected, said function triggering means means being a magnetic positioner, and at least one of said input connections having a safety catch triggered by said magnetic positioner for preventing contacting of said at least one input connection with the measuring conductor.

17. The multimeter according to claim 1, said function triggering means being a magnetic positioner, and including input connections to which a measuring conductor is to be connected, and a locking system being triggerable for locking and preventing said measurement range switch from being switched to another measurable variable with the measuring conductor connected, at least one of said input connections having a contact maker for triggering said locking system by means of said magnetic positioner with the measuring conductor connected.

18. The multimeter according to claim 17 including a safety catch operatively associated with said at least one input connection.

19. The multimeter according to claim 1, wherein said at least one auxiliary circuit has an auxiliary circuit switch and a magnetic positioner, and including a locking system, and a manually actuable input circuit switch coupled to said auxiliary circuit switch, both said auxiliary circuit switch and said input circuit switch having zero positions from which said switches can be switched to a different measurable variable in different switching directions, said auxiliary circuit switch leading said input circuit switch for causing said magnetic positioner to disable said input circuit switch against switching on by said locking system when a measurable variable is switched on, if said measurement range switch is set to a measurable variable other than that which should be set by said input circuit switch.

20. The multimeter according to claim 19, wherein said measurement range switch has another locking system, said auxiliary switch has a switching section, and including a further magnetic positioner controlled by said switching section for releasing said other locking system only in the zero position, so that said respective input circuit has to be interrupted.

21. The multimeter according to claim 20, wherein said respective input circuit is interrupted by said input circuit switch.

22. The multimeter according to claim 20, wherein said respective input circuit is interrupted by said input circuit switch before switching said measurement range switch to another measurable variable.

23. The multimeter according to claim 19, including an amplifier monitoring an input signal, and another magnetic positioner for resetting said input circuit switch to the zero position, said other magnetic positioner being activated as soon as said amplifier detects a drop in the input signal at least below a negligible threshold value.

24. The multimeter according to claim 1, said function triggering means being magnetic positioners, and including an auxiliary switch having a switching section acting as a switch, and a common input connection to which a measuring conductor is to be connected for a plurality of measurable variables, said auxiliary switch having a zero position and further switch settings in each of which said switching section only releases one of said magnetic positioners for activation.

25. The multimeter according to claim 1, including input connections to which a measuring conductor is to be connected, said function triggering means being an indicator lamp issuing an optical signal, and said indicator lamp being assigned to one of said input circuits for revealing with the optical signal one of said input circuits to which the measuring conductor is connected after suitably positioning said measurement range switch or one of said input circuits to which the measuring conductor has to be connected, if said input circuits are applied to different input connections.

26. The multimeter according to claim 25, wherein the optical signal has a type revealing one of said input circuits to which the measuring conductor is connected or has to be connected.

27. The multimeter according to claim 25, wherein the optical signal has a spatial assignment revealing one of said input circuits to which the measuring conductor is connected or has to be connected.

* * * * *